(12) United States Patent
Liaw

(10) Patent No.: US 7,864,561 B2
(45) Date of Patent: Jan. 4, 2011

(54) CELL STRUCTURE WITH BURIED CAPACITOR FOR SOFT ERROR RATE IMPROVEMENT

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 274 days.

(21) Appl. No.: 11/495,369

(22) Filed: Jul. 28, 2006

(65) Prior Publication Data

US 2008/0025092 A1    Jan. 31, 2008

(51) Int. Cl.
*G11C 11/00* (2006.01)
(52) U.S. Cl. .................... 365/154; 365/149; 365/145
(58) Field of Classification Search ................ 365/154, 365/174, 102, 149, 145, 49.11
See application file for complete search history.

(56) References Cited

U.S. PATENT DOCUMENTS 6,831,852 B2 * 12/2004 Ishigaki et al. .............. 365/149
2003/0123276 A1 * 7/2003 Yokozeki .................... 365/145
2004/0076071 A1 * 4/2004 Liaw .......................... 365/232
2005/0141265 A1 * 6/2005 Yokoyama ................... 365/154

* cited by examiner

*Primary Examiner*—Pho M Luu
*Assistant Examiner*—Han Yang
(74) *Attorney, Agent, or Firm*—Tung & Associates

(57) ABSTRACT

A semiconductor memory device with an improved protection against soft errors includes a bi-stable flip-flop cell having a data storage node and a data bar storage node. A first capacitor electrically couples the data storage node to a predefined voltage and a second capacitor electrically couples the data bar storage node to the predefined voltage. Each one of the first and second capacitors includes a top conductive electrode overlying a bottom contact electrode with a dielectric layer disposed in-between. The bottom contact electrode overlays at least two different active regions forming the data and data bar storage nodes.

20 Claims, 15 Drawing Sheets

CELL STRUCTURE WITH BURIED CAPACITOR FOR SOFT ERROR RATE IMPROVEMENT

BACKGROUND OF THE INVENTION

The present invention relates generally to integrated circuits and methods for memory cells and more particularly to memory cells that offer improved protection against soft errors.

Reduced geometry integrated circuit ("IC") chip designs are being adopted to increase the density of devices within integrated circuits, thereby increasing performance and decreasing the cost of the ICs. Modem IC memory chips, such as dynamic random access memory ("DRAM"), static random access memory ("SRAM"), and read only memory ("ROM"), are examples of chips having increasingly higher densities and lower costs. Increases in chip density are primarily accomplished by forming smaller structures within devices and by reducing the separation between devices or between the structures that make up the devices. Typically higher density memory chips often operate under lower voltage levels.

Reduced, sub-micron level geometries and reduced operating voltages deployed in these chips make them vulnerable to particle induced soft errors. Typically, soft errors occur when charged particles penetrate a memory cell and cross a junction, creating an abnormal charge that undesirably causes the state of the memory cell to change. Among the common sources of soft errors are alpha particles emitted by contaminants in memory chip packages and/or cosmic rays penetrating the earth's atmosphere. A soft error is typically not caused as a result of any permanent physical defect in the memory cell, and may be fixed by simply writing new data to the invalid memory cell. Occurrences of soft errors typically reduce the reliability of the memory cell.

Functionality and fabrication method of a memory cell such as a conventional SRAM based on complementary metal oxide semiconductor (CMOS) technology is well known. Traditional techniques to reduce the soft error occurrence in the memory cell have focused on increasing the capacitance of the charge storage node(s) of the cell, where charge $Q=C*V$. The following U.S. patents and technical papers describe various aspects of reducing soft error rates (SER) in memory cells and are incorporated herein by reference:

a) U.S. Pat. No. 6,649,456 entitled 'SRAM Cell Design For Soft Error Rate Immunity'.
b) U.S. Pat. No. 5,886,375 entitled 'SRAM Having Improved Soft-Error Immunity'.
c) IEDM-2003 Session-11 "Soft Error Immune 0.46 µm² SRAM Cell With MIM Node Capacitor By 65 nm CMOS technology For Ultra High Speed SRAM", Soon-Moon Jung, Samsung, South Korea.
d) "STMicro hardens embedded SRAM against soft errors", Peter Clarke, Silicon Strategies, Dec. 15, 2003.

Other conventional SER reduction processes include the Deep_Nwell and polyimide processes. However, many of these conventional techniques often result in increasing the substrate surface area, and/or introducing additional substrate layers. This typically results in fabricating lower capacitor values per unit area of the chip, adds to its complexity and raises its cost.

Thus, a need exists to provide a memory cell that offers improved protection against soft errors. Additionally, it would be desirable for the improved memory cell to offer increased capacitances per unit area, improved SER reliability, be cost effective, and be accommodated in the same substrate area and/or layer structure as a traditional memory cell.

SUMMARY OF THE INVENTION

The problems outlined above are addressed in a large part by an apparatus and method for reducing soft errors of a SRAM memory cell, as described herein. According to one form of the invention, a semiconductor memory device with an improved protection against soft errors includes a bi-stable flip-flop cell having a data storage node and a data bar storage node. A first capacitor electrically couples the data storage node to a predefined voltage and a second capacitor electrically couples the data bar storage node to the predefined voltage. Each one of the first and second capacitors includes a top conductive electrode overlying a bottom contact electrode with a dielectric layer disposed in-between. The bottom contact electrode overlays at least two different active regions forming the data and data bar storage nodes.

According to another aspect of the invention, a layout of a SRAM cell having improved protection against soft errors includes a pair of cross coupled inverters arranged in a form substantially representing a rectangle. The SRAM cell is operable to store data in a data storage node and a data bar storage node. Each of the inverters includes a pull-up transistor and a pull-down transistor formed by at least two different active regions. A portion of a first metal layer forms the data storage node and another portion of the first metal layer forms the data bar storage node. A first capacitor is formed between the first metal layer and a second metal layer so as to electrically couple the data storage node to a predefined voltage. The portion of the first metal layer serves as a bottom conductive electrode and the second metal layer serving as a top conductive electrode with a dielectric layer disposed in-between. The portion of the first metal layer overlays the at least two different active regions, which form the data storage node. A second capacitor is formed between the another portion of the first metal layer and the second metal layer. The second capacitor electrically couples the data bar storage node to the predefined voltage. The another portion of the first metal layer serves as the bottom conductive electrode and the second metal layer serving as the top conductive electrode with the dielectric layer disposed in-between. The another portion of first metal layer overlays the at least two different active regions forming the data bar storage node.

Other forms, as well as objects and advantages of the invention will become apparent upon reading the following detailed description and upon reference to the accompanying drawings.

BRIEF DESCRIPTION OF THE DRAWINGS

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings, wherein:

FIG. 1B is a cross sectional diagram illustrating detail of a standard contact used in the memory cell of FIG. 1A;

DETAILED DESCRIPTION OF AN EMBODIMENT

Figure 1A:
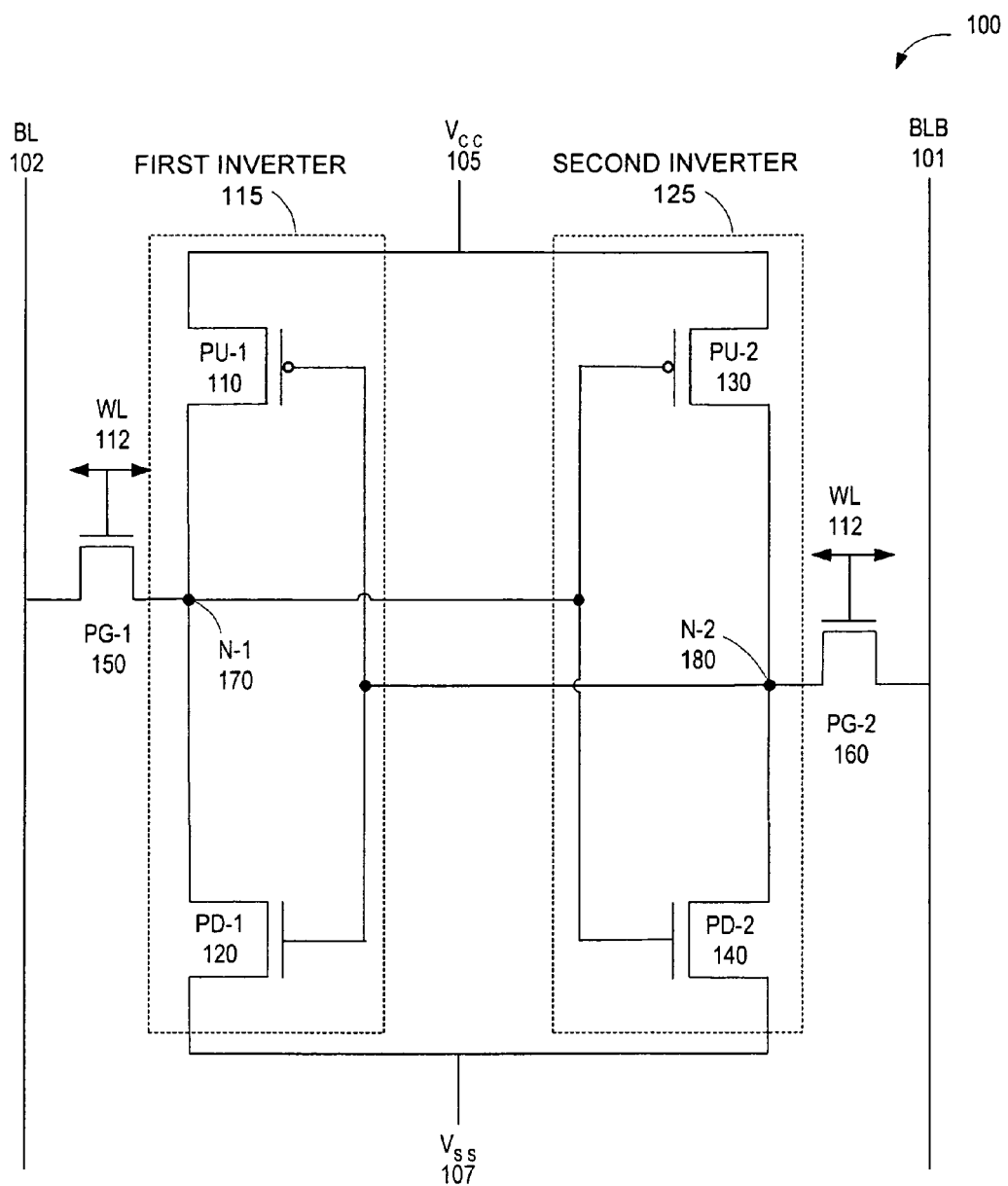
FIG. 1A is an illustrative circuit diagram of a conventional CMOS type SRAM memory cell.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Elements, which appear in more than one figure herein, are numbered alike in the various figures. The present invention describes an apparatus and method to reduce soft error rate of a SRAM memory cell. According to one form of the invention, a semiconductor memory device with an improved protection against soft errors includes a bi-stable flip-flop cell having a data storage node and a data bar storage node. A first capacitor electrically couples the data storage node to a predefined voltage and a second capacitor electrically couples the data bar storage node to the predefined voltage. Each one of the first and second capacitors includes a top conductive electrode overlying a bottom contact electrode with a dielectric layer disposed in-between. The bottom contact electrode overlays at least two different active regions forming the data and data bar storage nodes.

SRAM cells are generally used in memory applications that require high-speed processing such as cache. The traditional SRAM cell design includes two types of architectures. A high-resistance load type memory cell and a CMOS type memory cell. The high-resistance load type cell is constructed of four transistors ("4T") and two high-resistance elements. The CMOS type cell is typically constructed of six transistors ("6T"). Due to the very small leakage current during data holding, the CMOS type SRAM cell design has high reliability and is widely used at the present. Other well-known types of SRAM cell designs include one-transistor type and three-transistor type that provide additional savings in size and power.

FIG. 1A is an illustrative circuit diagram of memory cell 100 of a conventional CMOS type SRAM. As is well known, a pair of cross-coupled inverters forms a memory cell. A first 'pull-up' MOS transistor PU-1 110 of a first conductive type, e.g., PMOS transistor (load transistor) and a second 'pull-down' MOS transistor PD-1 120 of a second conductive type, e.g., NMOS transistor (drive transistor) compose a first inverter 115. A third 'pull-up' MOS transistor PU-2 130 of the first conductive kind, e.g., PMOS transistor (load transistor) and a fourth 'pull-down' MOS transistor PD-2 140 of the second conductive kind, e.g., a NMOS transistor (drive transistor) compose a second inverter 125. The output of the first inverter 115 is connected to the input of the second inverter 125. That is, the pair of inverters 115 and 125 are cross-coupled. As is well known, the MOS transistors may be fabricated using CMOS technology that makes use of both P and N channel devices in the same substrate material.

The logic state can be written and read at a first memory node N-1 170 which is the output point of the first inverter 115 and also the input point of the second inverter 125, and a second memory node N-2 180 which is the output point of the second inverter 125 and also the input point of the first inverter 115. If node N-2 180 is higher than the switching threshold of the second inverter 125 then PD-1 120 pulls down node N-1 170. This in turn causes PU-2 130 to pull node N-2 higher 180. This positive feedback action forces memory node N-2 180 to a high state, e.g., $V_{CC}$ 105 and memory node N-1 170 to a low state, e.g., $V_{SS}$ 107. Thus the memory cell 100 stores a value of one when memory node N-2 180 is high and N-1 170 is low. Similarly, if the cell stores a zero then node N-2 180 is low and N-1 170 is high. The first memory storage node 170 and the second memory storage node 180 may also be known as a data storage node and a data bar storage node respectively, and the memory cell 100 may also known as a bi-stable flip-flop.

The stored value in the memory cell 100 may be altered and read through NMOS access transistors PG-1 150 and PG-2 160. The NMOS transistor PG-2 160 has its gate connected to a word line WL 112, the source connected to the N-2 180, and the drain connected to a positive phase bit line BL 102. The NMOS transistor PG-1 150 has its gate connected to the word line WL 112, the source connected to N-1, and the drain connected to a negative phase bit line BLB 101. Thus, by selection of word line WL, positive phase bit line BL, and negative phase bit line BLB, the memory value stored in the memory node N-1 170 or N-2 180 can be read out.

As described earlier, reduced design rules in SRAM's often reduce the size of the transistor gates, thereby reducing the capacitance of the charge stored on memory nodes N-1 170 and N-2 180. By reducing the capacitance of the nodes or by reducing the voltage at which charge is stored on the nodes, traditional SRAM designs store reduced levels of charge on the nodes N-1 170 and N-2 180. Reducing the amount of charge stored on the nodes of an SRAM makes it more likely that an undesired charge generation event in the SRAM, especially in the substrate adjacent one of the storage nodes may result in a soft error. The undesired charge generation event may be caused by a disturbance, such as might be associated with alpha particles. The alpha particle generates hole-electron pairs on the well junction areas. The NMOS memory node N-1 170 or N-2 180 holding the charge for the high level may collect these electrons causing the charge to deplete. The disturbance can reduce the difference in the charge levels stored on the nodes of the SRAM memory cell 100 to an unacceptably small level, e.g., below a threshold level, and increase the likelihood that an erroneous binary data state will be detected when reading data from the SRAM memory cell.

FIG. 1B is a cross sectional diagram illustrating detail of a standard contact 172 for electrical coupling between the data storage node 170 (formed by electrically coupling the drain region of PU-1 110 and PD-1 120 with each of the gates of PU-2 130 and PD-2 140) and a metal-1 layer 174 of the SRAM cell 100. A via-1 176 electrically couples the metal-1 layer 174 to the metal-2 layer 178. Additional metal layers such as metal-3 (not shown) may be present. The metal-3 layer is typically connected to lower metal layers such as the metal-2 layer 178 by a via-2 (not shown). The data storage node 180 has a similar arrangement (not shown).

Figure 1C:
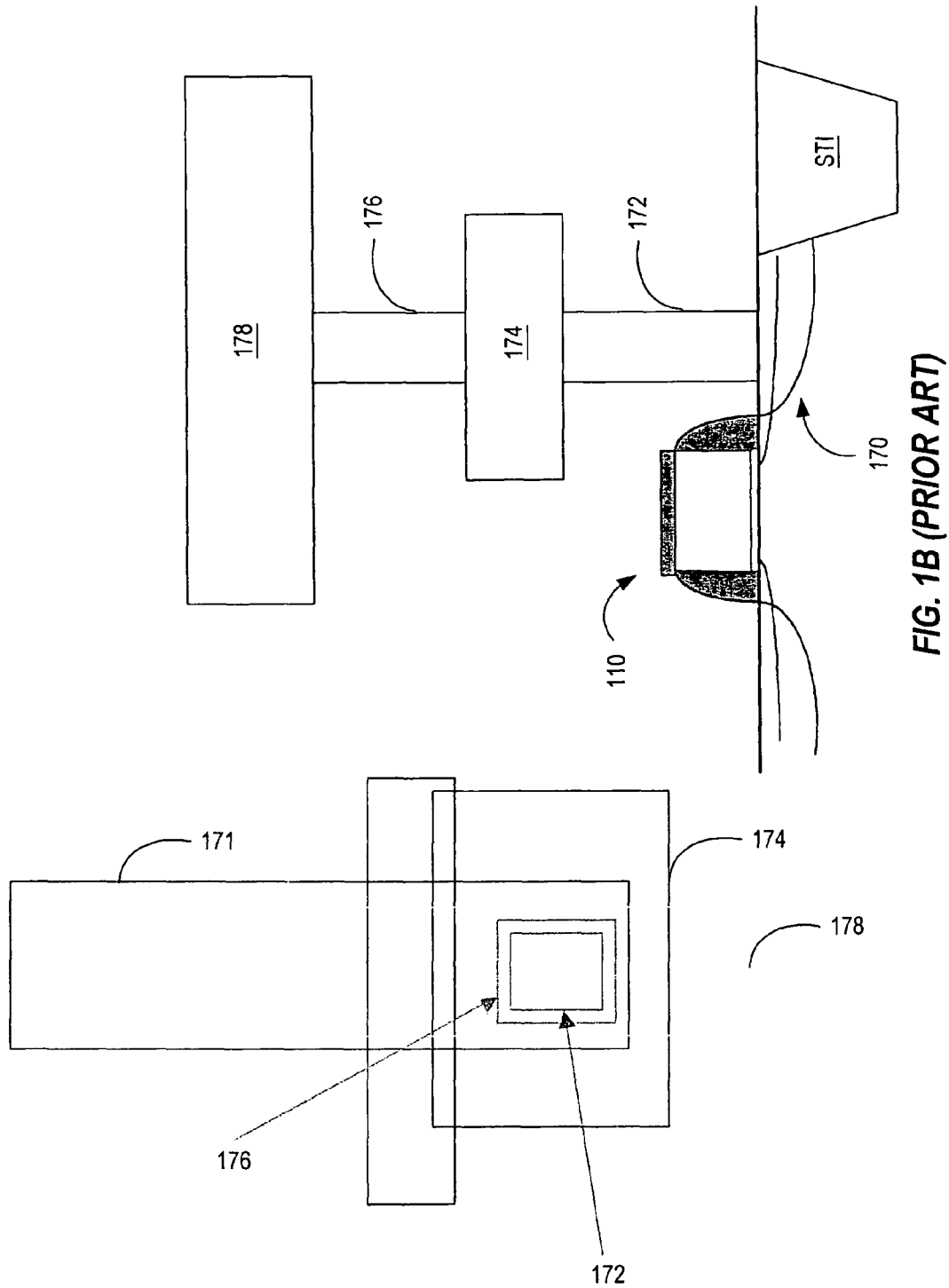
FIG. 1C is a top view illustrating an arrangement of various layers corresponding to FIG. 1B.

FIG. 1C is a top view illustrating an arrangement of various layers corresponding to FIG. 1B. The standard contact 172 electrically couples an active region 171 forming the data storage node 170 to the metal-1 layer 174. The via-1 176 electrically couples the metal-1 layer 174 to the metal-2 layer 178. The specific dimensions of the standard contact 172 may vary depending on process technology used. For example, as process technology progresses from 110 nanometers (nm) (or 0.11 microns) to 90 nm and to 65 nm (at present), the specific dimensions of the standard contact 172 may reduce accordingly. For the 65 nm process, an area of the standard contact 172 is substantially similar to a square having a side of approximately 90 nm in length.

Figure 2A:
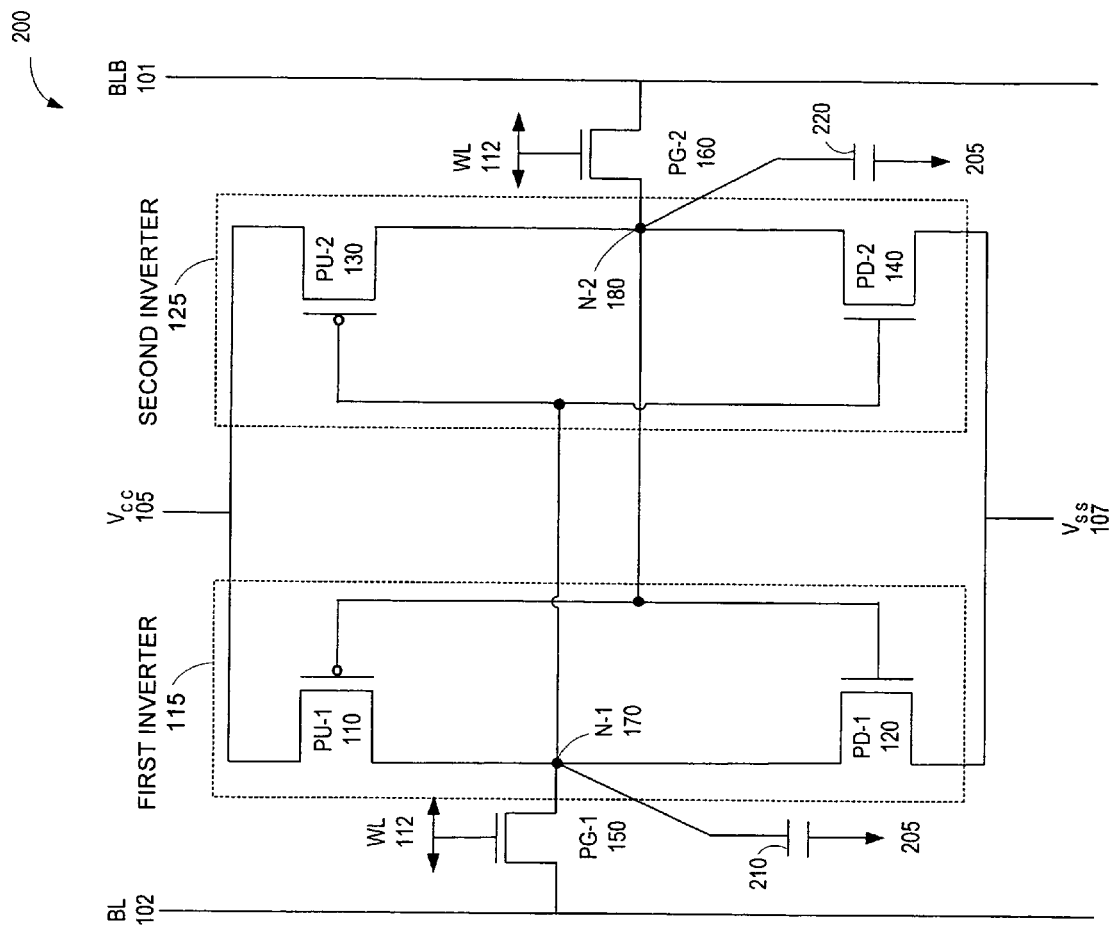
FIG. 2A is an illustrative circuit diagram of a memory device 200 having an improved protection against soft errors, according to one embodiment.

FIG. 2A is an illustrative circuit diagram of a memory device 200 having an improved protection against soft errors, according to one embodiment. The memory device 200 includes a bi-stable flip-flop cell, which is substantially similar to the SRAM cell 100 of FIG. 1, having a data storage node 170 and a data bar storage node 180. Also included in the memory device 200 is a first capacitor 210, which electrically couples the data storage node 170 to a predefined voltage 205, and a second capacitor 220, which electrically couples the data bar storage node 180 to the predefined voltage 205. In one embodiment, the predefined voltage 205 is $V_{CC}$ 105 (described in FIG. 3E). In one embodiment, the predefined voltage 205 is $V_{SS}$ 107 (described in FIG. 3F).

Figure 2B:
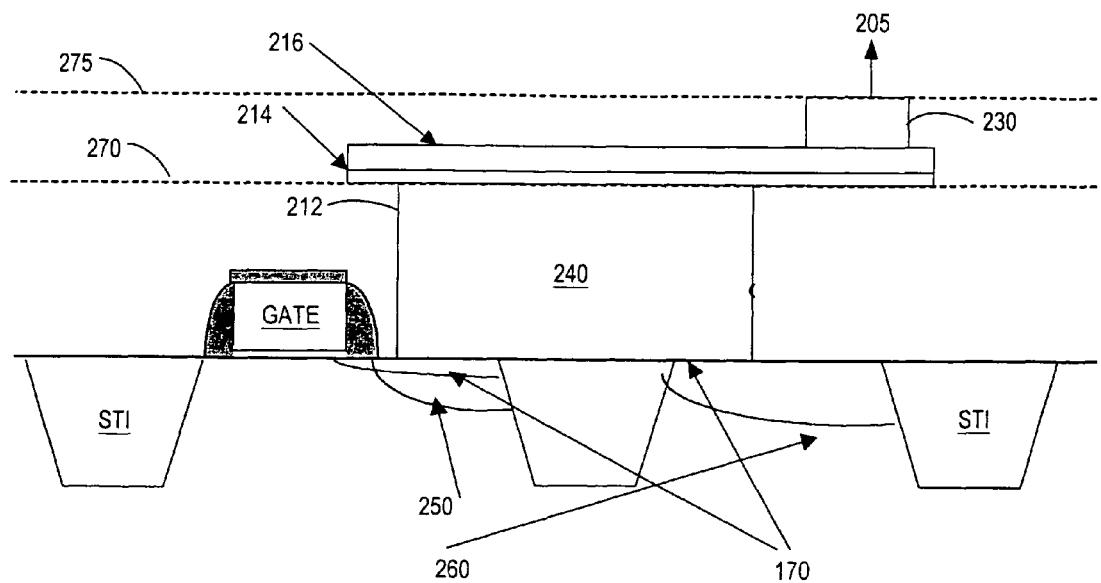
FIG. 2B is an exemplary cross sectional diagram illustrating detail of the electrical coupling between a data storage node and a capacitor included in the memory device 200 of FIG. 2A, according to one embodiment.

FIG. 2B is an exemplary cross sectional diagram illustrating detail of the electrical coupling between a data storage node and a capacitor included in the memory device 200, according to one embodiment. Each one of the first and second capacitors 210 and 220 (not shown) includes a top conductive electrode 216 overlying a bottom contact electrode 212 with a dielectric layer 214 disposed in-between. The top conductive electrode 216 is electrically coupled to a metal-1 layer 230, with the metal-1 layer 230 being electrically coupled to the predefined voltage 205. In one embodiment, the metal-1 layer 230 is substantially the same as the standard metal-1 layer 174.

In one embodiment, a dielectric material of the dielectric layer 214 may include SiON, Si3N4, Ta2O5, Al2O3, HfO, PEOX, TEOS, nitrogen content oxide layer, nitrided oxide, Hf content oxide, Ta content oxide, Al content oxide, high K material having K greater than 5, or a combination thereof. In one embodiment, a conductor material of top and bottom electrodes 212 and 216 may include W, Al, AlCu, Cu, Cu content, silicide, Ti, TiSi2, Co, CoSi2, Ni, NiSi, TiN, TiW, TaN, or a combination thereof.

In the depicted embodiment, the bottom contact electrode 212 of the first capacitor 210 is directly coupled to the data storage node 170 via a larger contact structure 240 compared to the standard contact 172 (not shown) used in the SRAM cell 100. The larger contact structure 240 overlays at least two different active regions 250 and 260 forming the data storage nodes 170. The larger contact structure 240 for the second capacitor 220, which is coupled to the data bar storage node 180, is substantially similar (not shown). The form and shape of the larger contact structure 240 may vary. In one embodiment, the larger contact structure 240 may be in the form of an L-shape (not shown).

In the depicted embodiment, a top portion 270 of the bottom contact electrode 212 is substantially aligned with the top portion of the standard contact 172. The dielectric layer 214 and the top conductive electrode 216 are located substantially within the standard metal-1 layer 174. That is, a relative position of a top 275 of the conductive electrode 216 is located substantially within a standard metal-1 layer 174 to front-end layers (active region or gate layer) of the standard SRAM cell 100 without the bottom contact electrode 212. The metal-1 layer 230 electrically couples the top conductive electrode 216 to the predefined voltage 205. Various other structures may be considered for forming the first and second capacitors 210 and 220 and are described in FIGS. 2C and 2D.

Figure 2E:
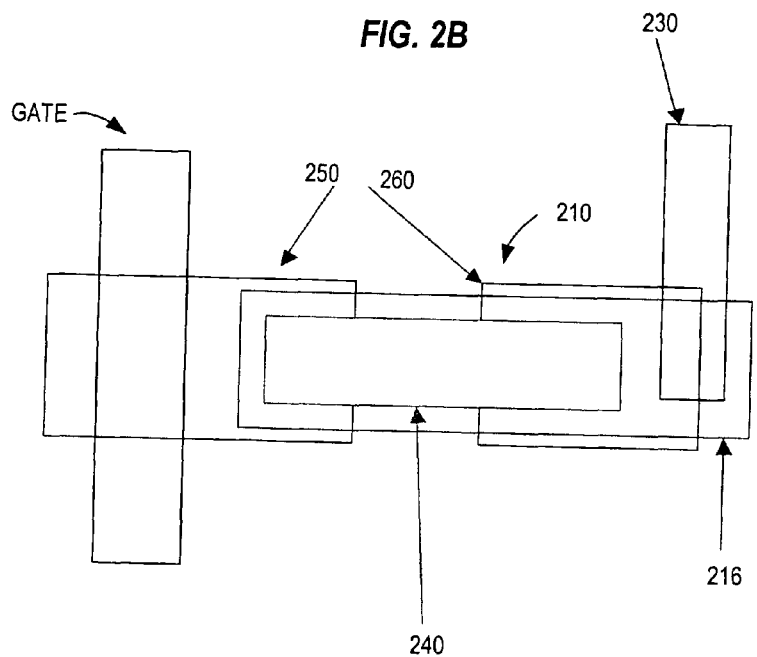
FIG. 2E is an exemplary top view corresponding to FIG. 2B illustrating a layout of a capacitor included in the memory device 200, according to one embodiment.
Figure 2C:
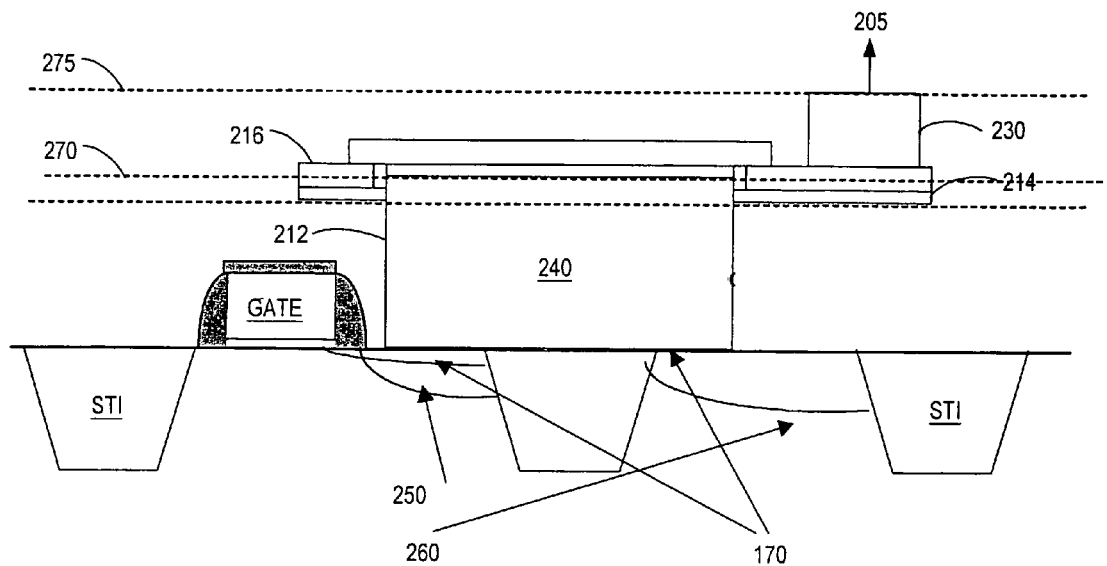
FIG. 2C is an exemplary cross sectional diagram illustrating detail of the electrical coupling between a data storage node and a capacitor included in the memory device 200, according to one embodiment.

FIG. 2C is an exemplary cross sectional diagram illustrating detail of the electrical coupling between a data storage node and a capacitor included in the memory device 200, according to one embodiment. In the depicted embodiment, the top portion 270 of the bottom contact electrode 212 protrudes within the standard metal-1 layer 174 thereby forming sidewalls. The dielectric layer 214 and the top conductive electrode 216 are located substantially within the standard metal-1 layer 174. The metal-1 layer 230 electrically couples the top conductive electrode 216 to the predefined voltage 205.

Figure 2D:
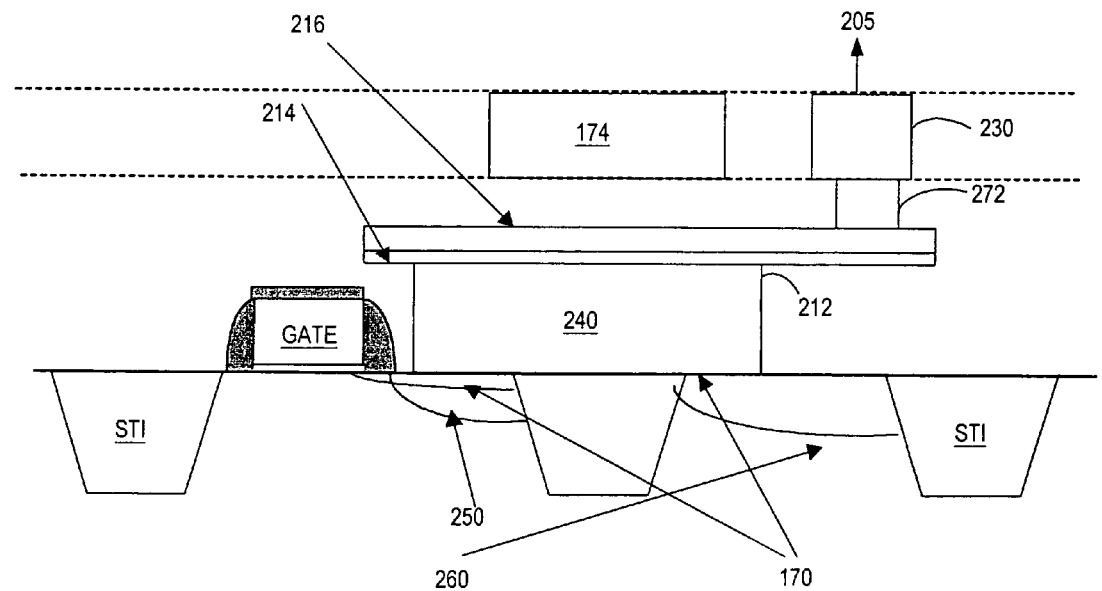
FIG. 2D is an exemplary cross sectional diagram illustrating detail of the electrical coupling between a data storage node and a capacitor included in the memory device 200, according to one embodiment.

FIG. 2D is an exemplary cross sectional diagram illustrating detail of the electrical coupling between a data storage node and a capacitor included in the memory device 200, according to one embodiment. In the depicted embodiment, the dielectric layer 214 and the top conductive electrode 216 are located below the standard metal-1 layer 174. A standard contact 272 electrically couples the top conductive electrode 216 to the metal-1 layer 230. Thus, the metal-1 layer 230 electrically couples the top conductive electrode 216 to the predefined voltage 205 via the standard contact 272. In one embodiment, the standard contact 272 is substantially similar to the standard contact 172.

FIG. 2E is an exemplary top view corresponding to FIG. 2B illustrating a layout of a capacitor included in the memory device 200, according to one embodiment. In the depicted embodiment, the first capacitor 210 having the larger contact structure 240 overlays at least two different active regions 250 and 260 forming the data storage node 170 (not shown). The top conductive electrode 216 is coupled to the metal-1 layer 230. The layout for the second capacitor 220 coupled to the data bar storage node 180 has a similar layout arrangement (not shown).

As described earlier, the specific shape and dimensions of the larger contact structure 240 may vary depending on technology used. For example, for the 65 nm process, the area of the larger contact structure 240 is substantially similar to a rectangle having a length of approximately 310 nm and a width of approximately 90 nm. Thus, an area of the larger contact structure 240 is at least three times larger compared to a contact area of the standard contact 172 in the standard SRAM cell 100 without the bottom contact electrode.

Figure 3A:
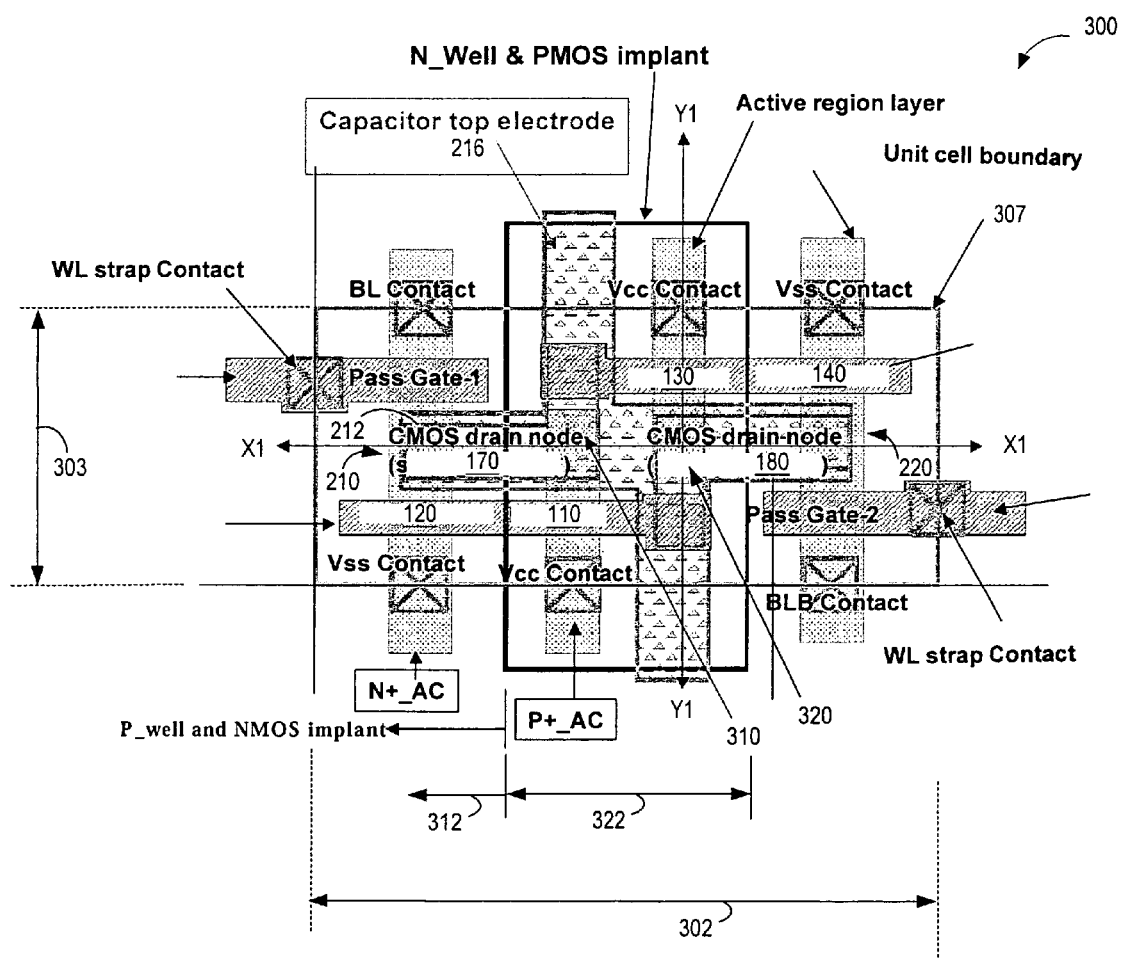
FIG. 3A is an exemplary top view of a layout 300 for the memory device 200 of FIG. 2A, according to one embodiment.

FIG. 3A is an exemplary top view of a layout 300 for the memory device 200 of FIG. 2A, according to one embodiment. The layout 300 for the memory device 200 provides an improved protection against soft errors. The memory device 200 is arranged in a form substantially representing a rectangle, as illustrated by a unit cell 307 having a width 303 and a length 302. In the depicted embodiment, the length 302 is greater than the width 303.

The layout 300 includes at least different two active regions. In one embodiment, a first active region 312 is formed by an NMOS implant in a P_well and a second active region 322 is formed by a PMOS implant in an N_well. In one embodiment, the first and second active regions 312 and 322 are the same as the at least two different active regions 250 and 260. The data storage node 170 is formed by electrically coupling the drain region of PU-1 110 and PD-1 120 with each of the gates of PU-2 130 and PD-2 140 by a first L-shaped contact 310. Similarly, the data bar storage node 180 is formed by electrically coupling the drain region of PU-2 130 and PD-2 140 with each of the gates of PU-1 110 and PD-1 120 by a second L-shaped contact 320. In one embodiment, the larger contact structure 240 is implemented in the form of the L-shaped contact 310 and 320. Additional cross sectional views (along X1-X1 and Y1-Y1 axes) of the layout 300 are illustrated in FIGS. 3B and 3C.

In the depicted embodiment, the first capacitor 210 includes the first L-shaped contact 310 serving as the bottom contact electrode 212 and the top conductive electrode 216 overlying the bottom contact electrode 212 with the dielectric layer 214 disposed in-between (not shown). Similarly, the second capacitor 220 includes the second L-shaped contact 320 serving as the bottom contact electrode 212 and the top conductive electrode 216 overlying the bottom contact electrode 212 with the dielectric layer 214 disposed in-between (not shown). That is, the larger contact structure 240 (not shown) is represented by the L-shaped contacts 310 and 320 having an L-shaped form.

As described earlier, the specific dimensions of the L-shaped contacts 310 and 320 may vary depending on technology used. In one embodiment, the L-shaped contacts 310 and 320 may be formed by placing two rectangles substantially perpendicular to each other and sharing a corner. For the 65 nm process, the area of each of the L-shaped contacts 310 and 320 is substantially similar to one rectangle having a length of approximately 310 nm and a width of approximately 90 nm and a second rectangle having a length of approximately 90 nm and a width of approximately 140 nm, with the two rectangles being placed at right angles and sharing a corner to form the L-shaped contact.

Figure 3B:
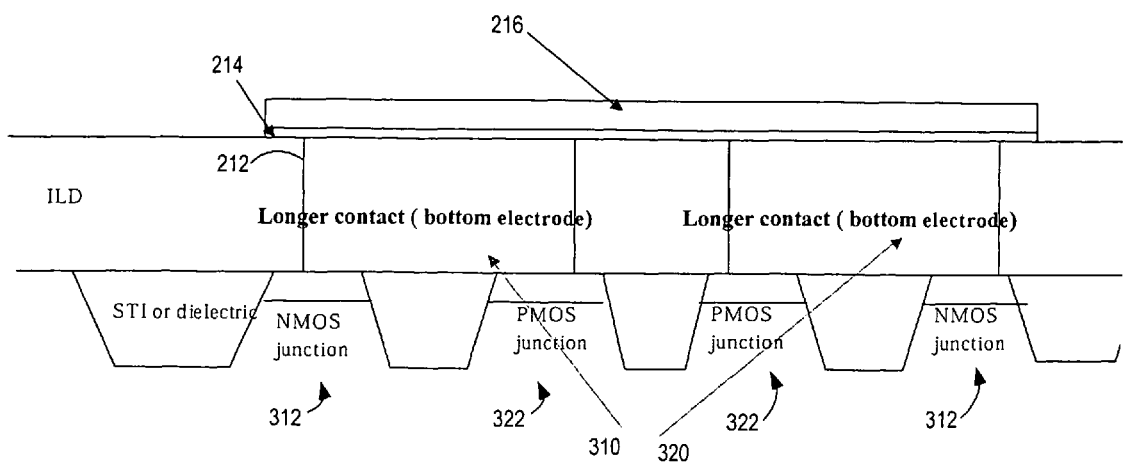
FIG. 3B is an exemplary cross sectional view (along X1-X1 axis) of the layout 300 of FIG. 3A, according to one embodiment.
Figure 3C:
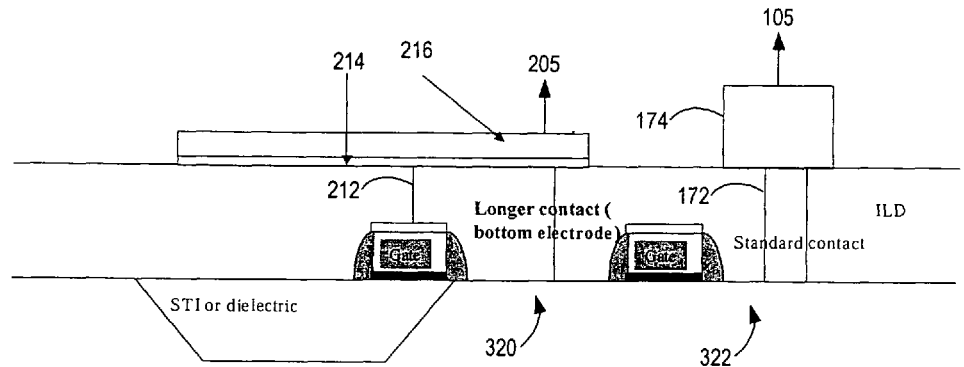
FIG. 3C is an exemplary cross sectional view (along Y1-Y1 axis) of the layout 300 of FIG. 3A, according to one embodiment.

FIG. 3B is an exemplary cross sectional view (along X1-X1 axis) of the layout 300 of FIG. 3A, according to one embodiment. In the depicted embodiment, the first L-shaped contact 310 overlays the first and second active regions 312 and 322, which form the data storage node 170 (not shown). Similarly, the second L-shaped contact 320 overlays the first and second active regions 312 and 322, which form the data bar storage node 180 (not shown). The top conductive electrode 216 overlays the bottom contact electrode 212 with the dielectric layer 214 disposed in-between.

FIG. 3C is an exemplary cross sectional view (along Y1-Y1 axis) of the layout 300 of FIG. 3A, according to one embodiment. In the depicted embodiment, the second L-shaped contact 320, which forms the top conductive electrode 216, overlays a portion of the gate of the first inverter 115 (not shown). The top conductive electrode 216 overlays the bottom contact electrode 212 with the dielectric layer 214 disposed in-between. The standard contact 172 electrically couples a portion of the second active region 322 to the $V_{CC}$ 105.

Figure 3D:
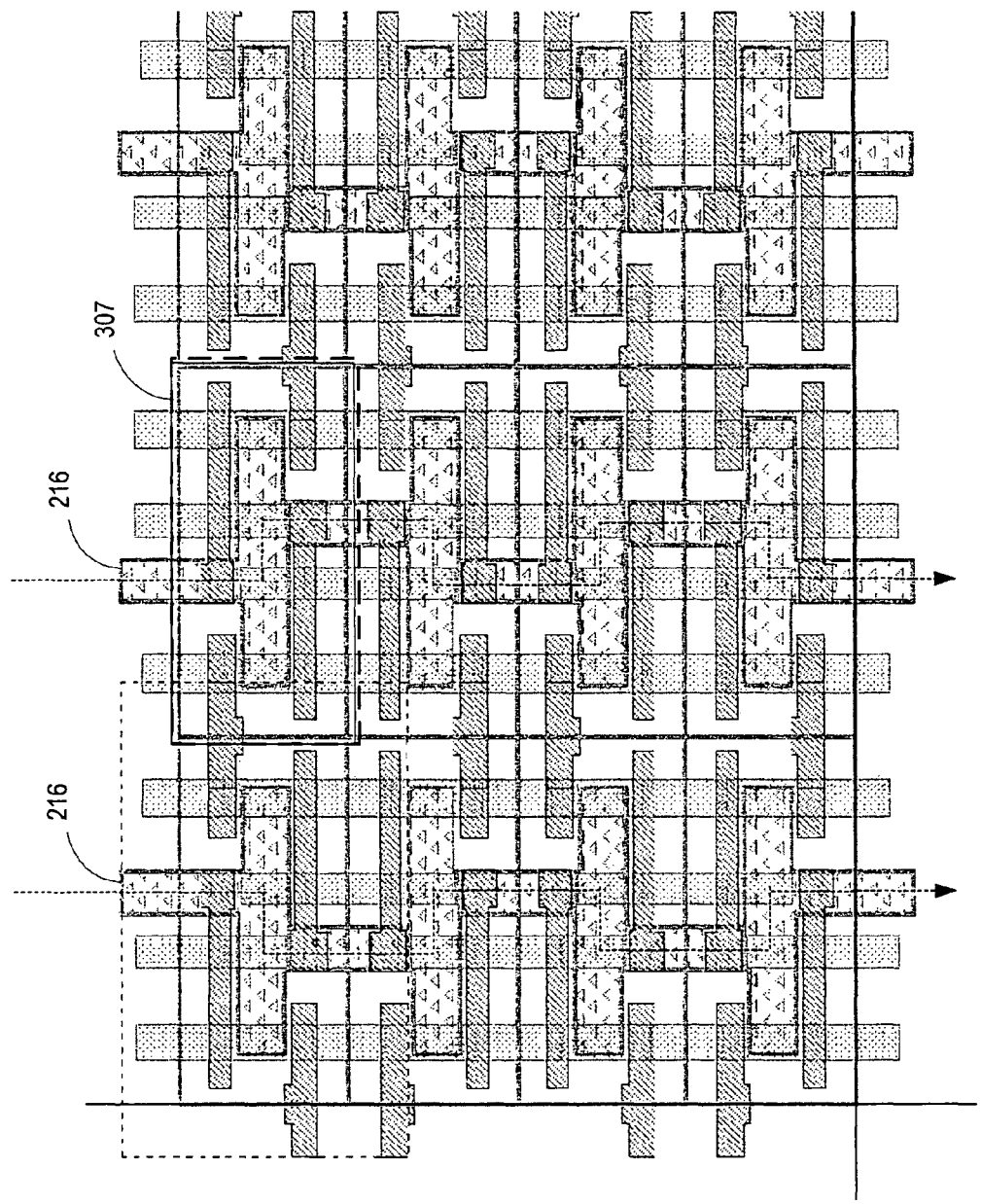
FIG. 3D is an exemplary top view of an arrangement connecting top electrodes included in a plurality of unit cells of FIG. 3A, according to one embodiment.

FIG. 3D is an exemplary top view of an arrangement connecting top electrodes included in a plurality of unit cells of FIG. 3A, according to one embodiment. Each unit cell 307 is arranged as shown to facilitate the electrical coupling of the top conductive electrode 216 of each memory device 200 to the predefined voltage 205 (not shown). Additional detail of the electrical coupling between the top conductive electrode 216 and the predefined voltage 205, which is set to $V_{CC}$ 105 or $V_{SS}$ 107 are described in FIGS. 3E and 3F.

Figure 3E:
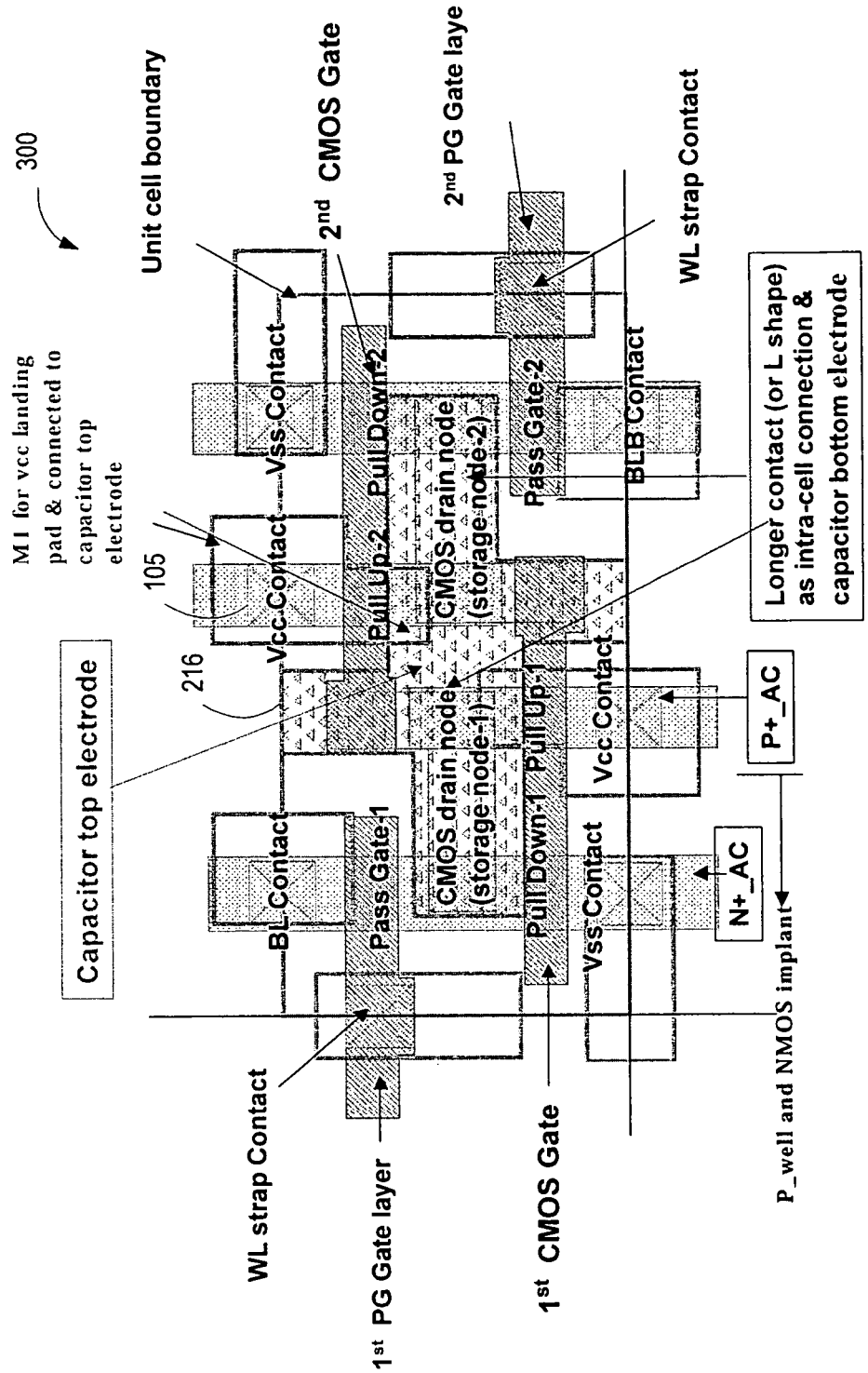
FIG. 3E is an exemplary top view of the layout 300 for the memory device 200 of FIG. 2A illustrating coupling between a top electrode and $V_{CC}$, according to one embodiment.

FIG. 3E is an exemplary top view of the layout 300 for the memory device 200 of FIG. 2A illustrating coupling between a top electrode and $V_{CC}$, according to one embodiment.

Figure 3F:
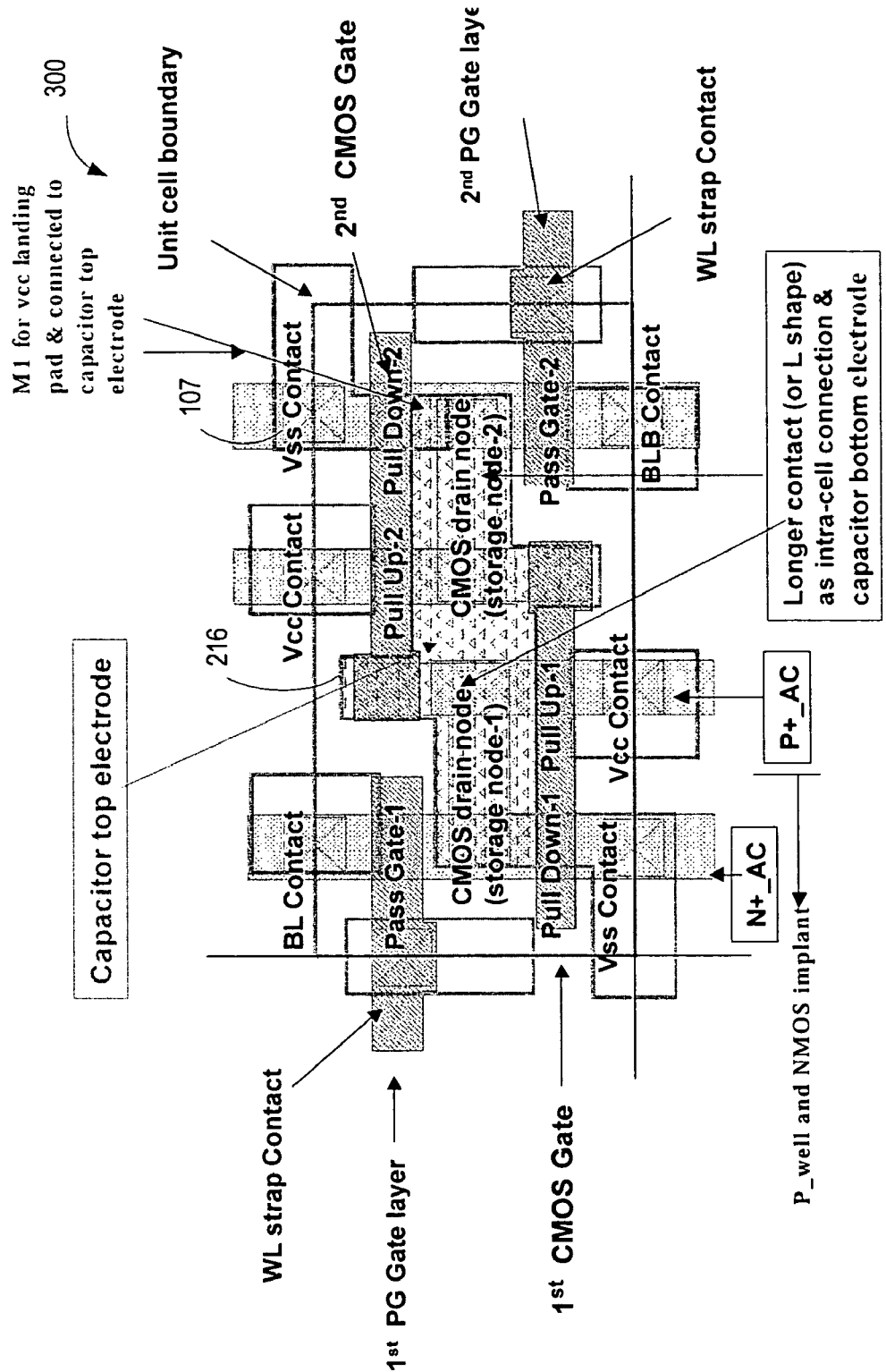
FIG. 3F is an exemplary top view of the layout 300 for the memory device 200 of FIG. 2A illustrating coupling between a top electrode and $V_{SS}$, according to one embodiment.

FIG. 3F is an exemplary top view of the layout 300 for the memory device 200 of FIG. 2A illustrating coupling between a top electrode and $V_{SS}$, according to one embodiment.

Figure 3G:
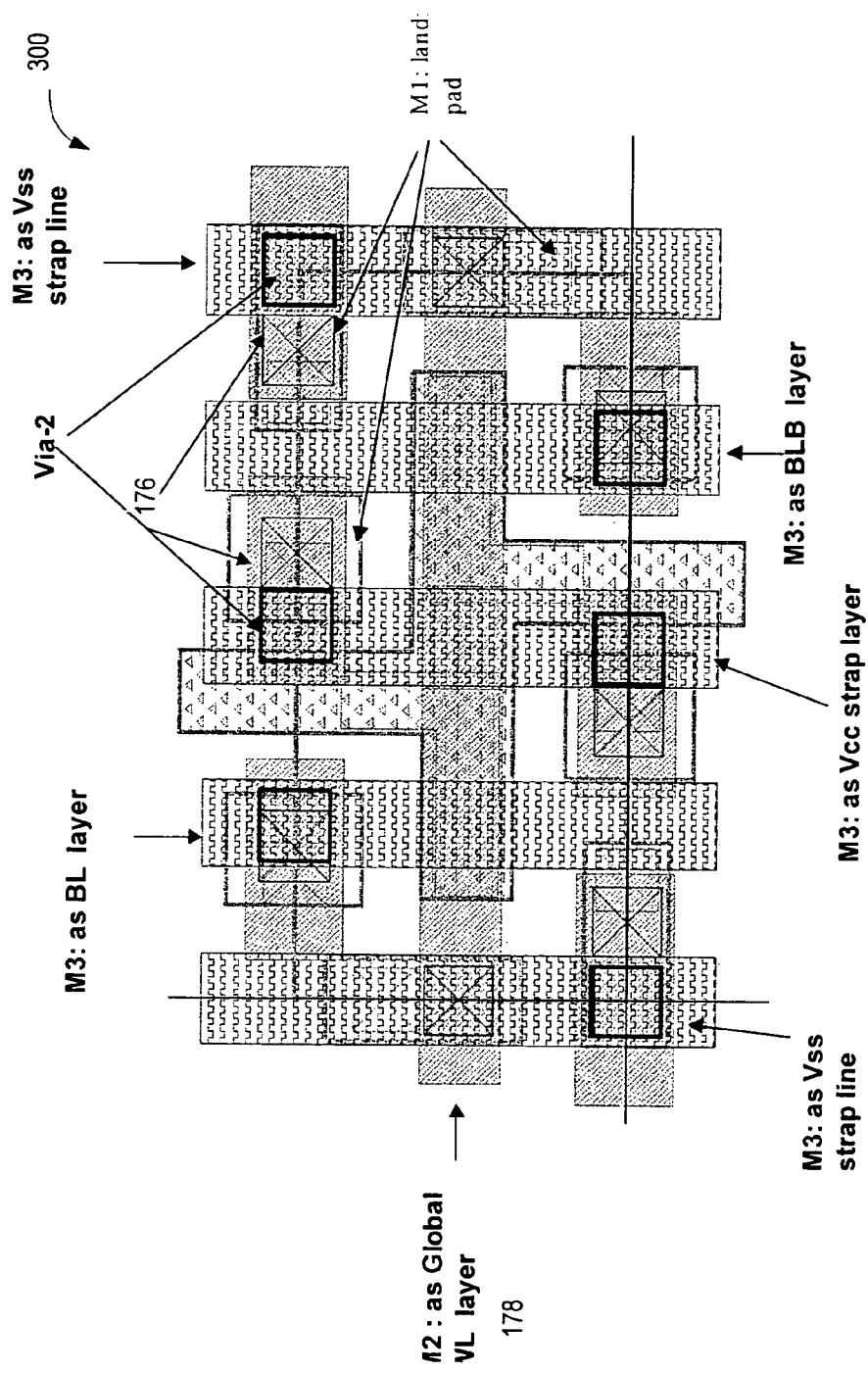
FIG. 3G is an exemplary top view of the layout 300 for the memory device 200 of FIG. 2A illustrating implementation of bit lines on metal-2 layer, according to one embodiment.

FIG. 3G is an exemplary top view of the layout 300 for the memory device 200 of FIG. 2A illustrating implementation of bit lines on metal-2 layer, according to one embodiment.

Figure 3H:
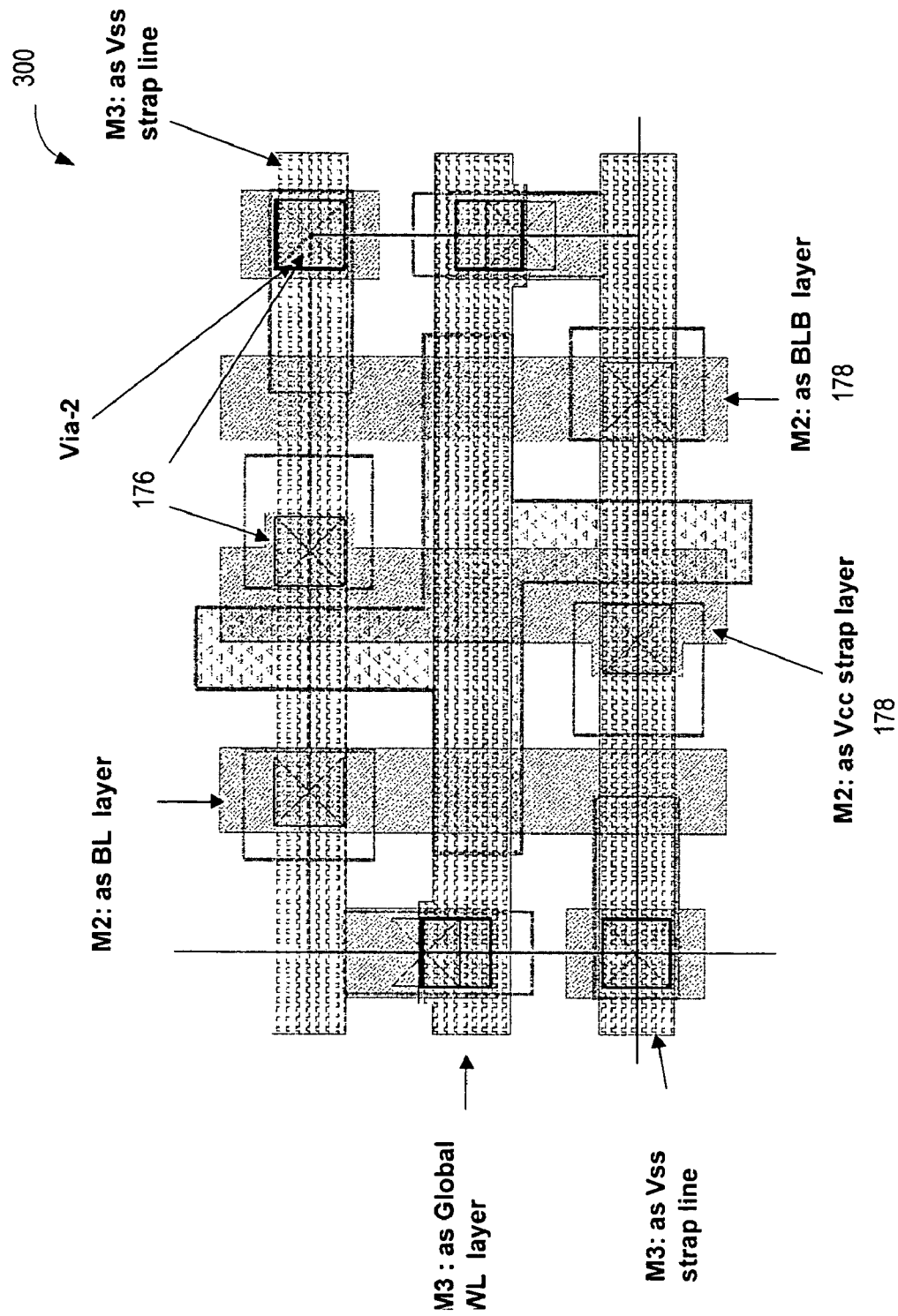
FIG. 3H is an exemplary top view of the layout 300 for the memory device 200 of FIG. 2A illustrating implementation of bit lines on metal-3 layer, according to one embodiment.

FIG. 3H is an exemplary top view of the layout 300 for the memory device 200 of FIG. 2A illustrating implementation of bit lines on metal-3 layer, according to one embodiment.

Figure 4A:
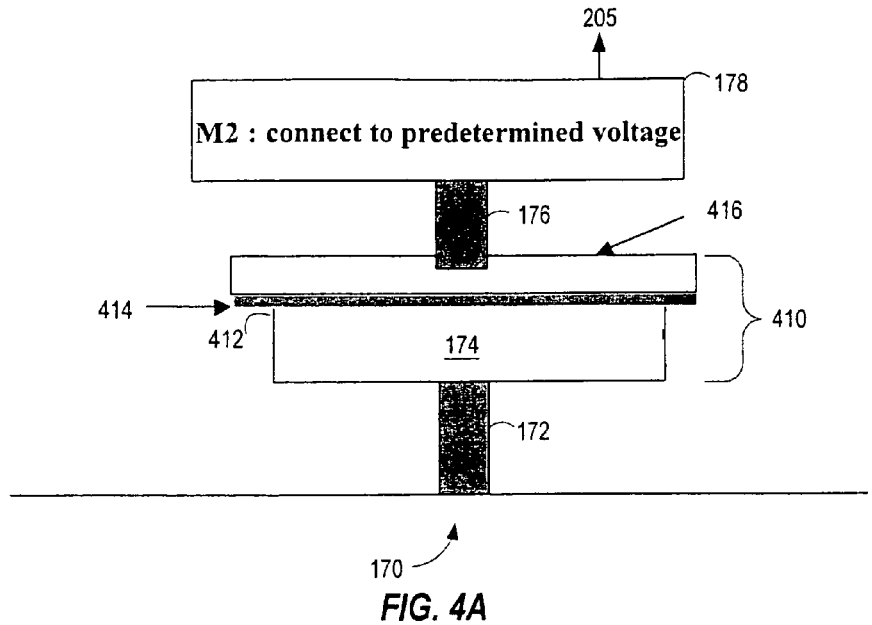
FIG. 4A is an exemplary cross sectional diagram illustrating detail of the electrical coupling between a data storage node and a capacitor formed on metal-1 layer of the memory device 200, according to one embodiment.

FIG. 4A is an exemplary cross sectional diagram illustrating detail of the electrical coupling between a data storage node and a capacitor formed on metal-1 layer of the memory device 200, according to one embodiment. In the depicted embodiment, capacitors are formed between the metal-1 layer 174 and the second metal layer 178. A portion of the metal-1 layer 174 serves as a bottom conductive electrode 412 of a first capacitor 410 and the second metal layer 178 is electrically coupled to the a top conductive electrode 416 by via-1 176. A dielectric layer 414 is disposed in-between the bottom conductive electrode 412 and the top conductive electrode 416. The first capacitor 410 electrically couples the data storage node 170 to the predefined voltage 205. A second capacitor (not shown) is similarly formed on the metal-1 174 layer.

Figure 4B:
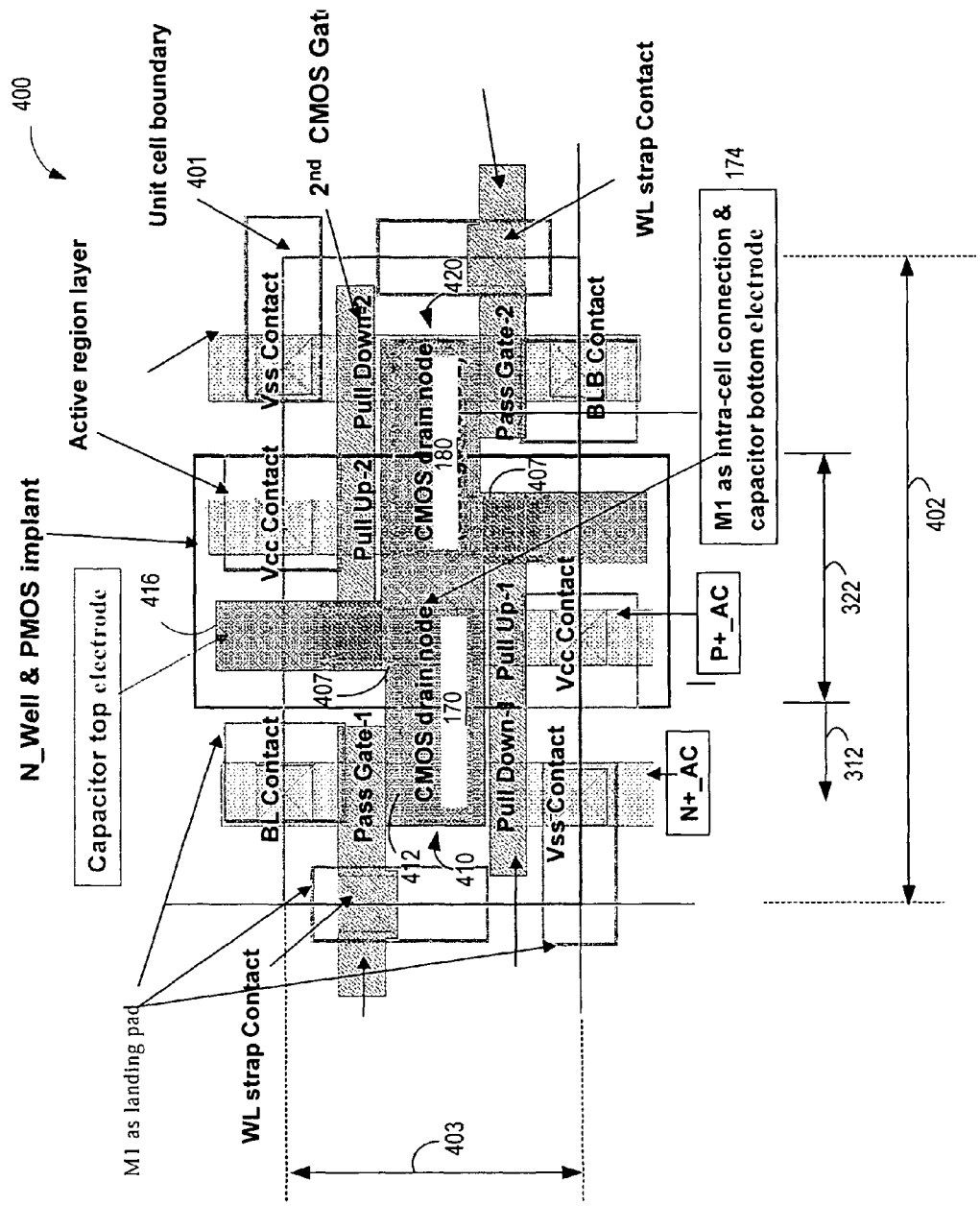
FIG. 4B is an exemplary top view of a layout 400 for the memory device 200 of FIG. 4A, according to one embodiment.

FIG. 4B is an exemplary top view of a layout 400 for the memory device 200 of FIG. 4A, according to one embodiment. The layout 400 for the memory device 200 provides an improved protection against soft errors. The memory device 200 is arranged in a form substantially representing a rectangle, as illustrated by a unit cell 401 having a width 403 and a length 402. In the depicted embodiment, the length 402 is greater than the width 403.

The layout 400 includes at least different two active regions. In one embodiment, the first active region 312 is formed by an NMOS implant in a P_well and the second active region 322 is formed by a PMOS implant in an N_well. In one embodiment, the first and second active regions 312 and 322 are the same as illustrated in FIG. 3A. The data storage node 170 is formed by electrically coupling the drain region of PU-1 110 and PD-1 120 with each of the gates of PU-2 130 and PD-2 140 by a first L-shaped contact 405. Similarly, the data bar storage node 180 is formed by electrically coupling the drain region of PU-2 130 and PD-1 140 with each of the gates of PU-1 110 and PD-1 120 by a second L-shaped contact 407. In one embodiment, the larger contact structure 240 is implemented in the form of the L-shaped contact structures 405 and 407.

In the depicted embodiment, the first capacitor 410 includes the first L-shaped contact 405 serving as the bottom contact electrode 412 and the top conductive electrode 416 overlying the bottom contact electrode 412 with the dielectric layer 414 disposed in-between (not shown). Similarly, the second capacitor 420 includes a second L-shaped contact 407 serving as the bottom contact electrode 412 and the top conductive electrode 416 overlying the bottom contact electrode 412 with the dielectric layer 414 disposed in-between (not shown). In the depicted embodiment, the portion of the metal-1 layer 174 forming the first capacitor 410 overlays the at least two different active regions 312 and 322 forming the data storage node 170. Similarly, the portion of the metal-1 layer 174 forming the second capacitor 420 overlays the at least two different active regions 310 and 320 forming the data bar storage node 180.

Figure 5:
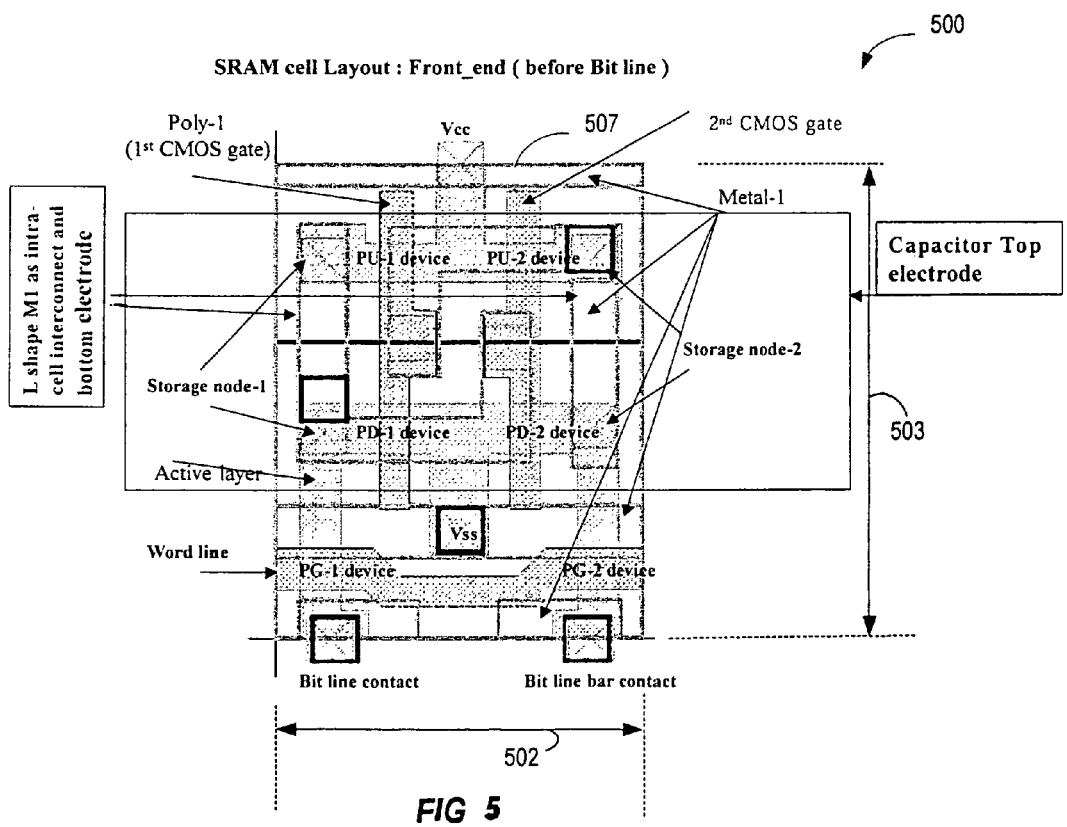
FIG. 5 is an exemplary top view of a front end layout 500 (before bit line) of the memory device 200 of FIG. 3A having a width of a unit cell greater than a length, according to one embodiment.

FIG. 5 is an exemplary top view of a front end layout 500 (before bit line) of the memory device 200 of FIG. 3A having a width of a unit cell greater than a length, according to one embodiment. The memory device 200 is arranged in a form substantially representing a rectangle, as illustrated by a unit cell 507 having a width 503 and a length 502. In the depicted embodiment, the length 502 is less than the width 503.

Figure 6:
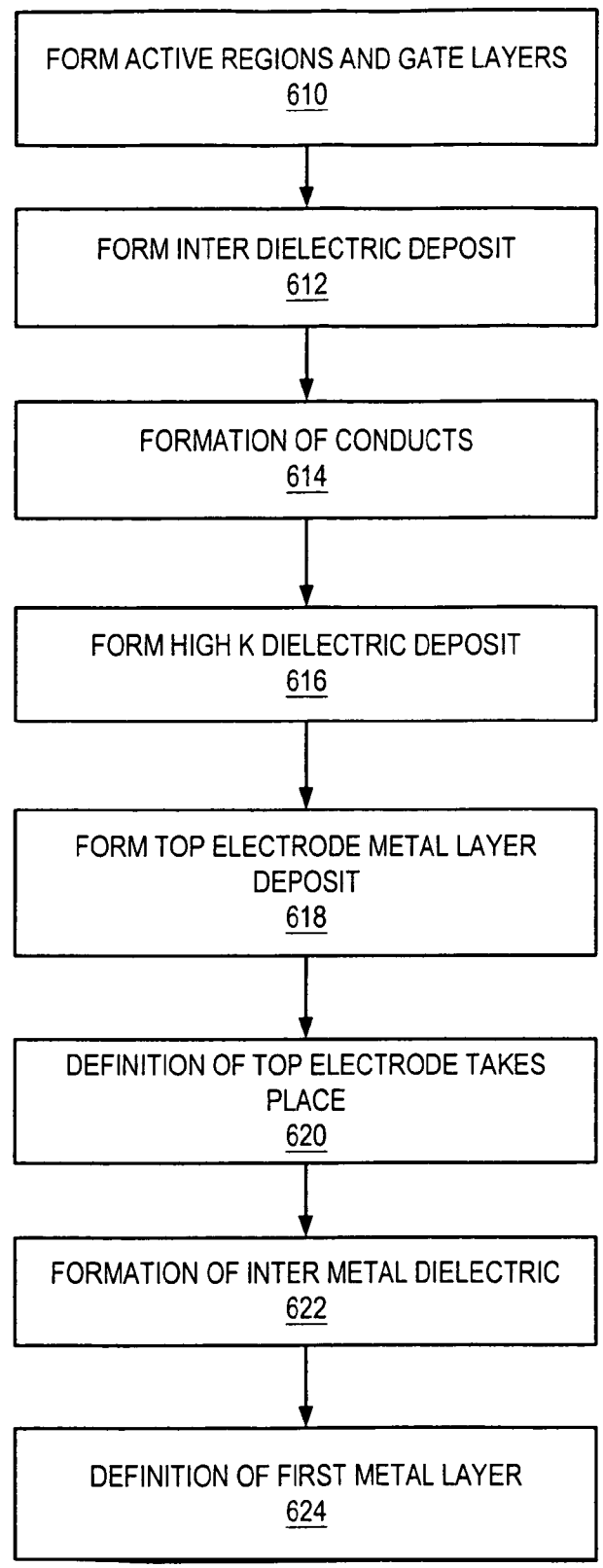
FIG. 6 is an illustrative flowchart of a method for forming the memory device 200 having buried capacitors on a semiconductor wafer and providing an improved protection against soft errors, according to an embodiment.

FIG. 6 is an illustrative flowchart of a method for forming the memory device 200 having buried capacitors on a semiconductor wafer and providing an improved protection against soft errors, according to an embodiment. In step 610, active region and gate layers are formed. In step 612, inter-dielectric deposit is formed. In step 614, contact (standard contact and longer (larger) contact) formation takes place. In step 616, a high K dielectric deposit is formed. In step 618, top electrode metal layer deposit is formed. In step 620, definition of top electrode takes place. In step 622, inter metal dielectric (such as SiC (barrier layer), low K dielectric (F or C content oxide), PEOX) deposit is formed. In step 624, definition of first metal layer (including photo-lithography, etch, CMP and metal deposit) takes place.

Thus, the manufacturing steps for the formation of longer (such as the bottom contact electrode 212 or the larger L-shaped contact structure 240) contacts are substantially same as that of the standard contact 172 layer. The manufacturing of an additional capacitor requires a few additional process steps (including one thin sputter, one lithography, and one etch).

Various steps of FIG. 6 may be added, omitted, combined, altered, or performed in different orders. For example, in one embodiment, the method may include the following steps:
 a. active region and gate layers formation.
 b. Inter-dielectric deposit.
 c. Conducts formation.
 d. Bottom electrode deposit.
 e. Bottom electrode definition.
 f. High K dielectric deposit.
 g. Top electrode metal layer deposit.
 h. Top electrode definition.
 i. Inter metal dielectric (like SiC(barrier layer), low K dielectric (F or C content oxide), PEOX) deposit.
 j. First metal definition (include photo-lithography, etch, CMP and metal deposit)

In another embodiment, the method may include the following steps:
 a. active region and gate layers formation.
 b. Inter-dielectric deposit.
 c. Conducts formation.
 d. Inter metal-1 dielectric (like SiC(barrier layer), low K dielectric(F or C content oxide), PEOX) deposit.
 e. First metal definition (include photo-lithography, etch, CMP and metal deposit)
 f. High K dielectric deposit.
 g. Top electrode metal layer deposit
 h. Top electrode definition.
 i. Inter metal-2 dielectric (like SiC(barrier layer), low K dielectric(F or C content oxide), PEOX) deposit.
 j. Second metal definition (include photo-lithography, etch, CMP and metal deposit)

In yet another embodiment, the method may include the following steps:
 a. active region and gate layers formation.
 b. Inter-dielectric deposit.
 c. Conducts formation.
 d. Inter metal-1 dielectric (like SiC (barrier layer), low K dielectric (F or C content oxide), PEOX) deposit.
 e. First metal definition (include photo-lithography, etch, CMP and metal deposit)
 f. Bottom electrode deposit.
 g. High K dielectric deposit.
 h. Top electrode metal layer deposit
 i. Top electrode definition.
 j. Inter metal-2 dielectric (like SiC (barrier layer), low K dielectric (F or C content oxide), PEOX) deposit.
 k. Second metal definition (include photo-lithography, etch, CMP and metal deposit).

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor memory device comprising:
 a bi-stable flip-flop cell having a data storage node and a data bar storage node;
 a first capacitor electrically coupling the data storage node to a predefined voltage; and
 a second capacitor electrically coupling the data bar storage node to the predefined voltage, wherein each of the first and second capacitors include a top conductive electrode overlying a bottom contact electrode with a dielectric layer disposed in-between, wherein the bottom contact electrode overlays and is coupled by a contact structure to at least two different active regions forming the data and data bar storage nodes, wherein said bottom contact electrode and said contact structure have substantially the same width and length dimensions.

2. The device of claim 1, wherein the top conductive electrode is electrically coupled to the predefined voltage.

3. The device of claim 1, wherein the bottom contact electrode is directly coupled to one of the storage nodes by a larger contact structure, wherein an area of the larger contact structure is at least three times larger compared to a contact area of a standard contact in a standard SRAM cell without the bottom contact electrode.

4. The device of claim 1, wherein the bottom contact electrode is disposed on a source/drain region of the storage nodes.

5. The device of claim 1, wherein the at least two different active regions include a first active region having a first MOS transistor of a first conductive type and a second active region having a second MOS transistor of a second conductive type being different from the first conductive type.

6. The device of claim 1, wherein a relative position of the top conductive electrode is located substantially within a standard metal-1 layer to front-end layers of a standard SRAM cell without the bottom contact electrode.

7. The device of claim 6, wherein another dielectric layer isolates the top conductive electrode and the standard metal-1 layer.

8. A SRAM cell layout for implementing improved protection against soft errors, the layout comprising:
a pair of cross coupled inverters arranged in a form substantially representing a rectangle to store data in a data storage node and a data bar storage node, wherein each of the inverters include a pull-up device and a pull-down device formed by at least two different active regions;
a first portion of a first metal layer forming the data storage node and a second portion of the first metal layer forming the data bar storage node;
a first capacitor disposed between the first metal layer and a second metal layer, wherein the first capacitor electrically couples the data storage node to a predefined voltage, wherein the first portion of the first metal layer serves as a bottom conductive electrode of the first capacitor and the second metal layer serves as a top conductive electrode with a dielectric layer disposed in-between, wherein the first portion of the first metal layer overlays and is coupled by a first contact structure to the at least two different active regions forming the data storage node, wherein said first capacitor bottom conductive electrode and said first contact structure have substantially the same width and length dimensions; and
a second capacitor disposed between the second portion of the first metal layer and the second metal layer, wherein the second capacitor electrically couples the data bar storage node to the predefined voltage, wherein the second portion of the first metal layer serves as a bottom conductive electrode of the second capacitor and the second metal layer serves as the top conductive electrode with the dielectric layer disposed in-between, wherein the second portion of first metal layer overlays and is coupled by a second contact structure to at least two different active regions forming the data bar storage node, wherein said second capacitor bottom conductive electrode and said second contact structure have substantially the same width and length dimensions.

9. The layout of claim 8, wherein the first metal layer forms the data storage node by electrically coupling:
a PD-1 drain of a pull down device of a first inverter;
a PU-1 drain of a pull up device of the first inverter; and
a gate corresponding to each one of a pull up device and pull down device of a second inverter, wherein the first and second inverters form the pair of cross coupled inverters.

10. The layout of claim 8, wherein the second portion of the first metal layer forms the data bar storage node by electrically coupling:
a PD-2 drain of a pull down device of a second inverter;
a PU-2 drain of a pull up device of the second inverter; and
a gate corresponding to each one of a pull up device and pull down device of a first inverter, wherein the first and second inverters form the pair of cross coupled inverters.

11. The layout of claim 8, wherein a pair of bit lines of the SRAM cell are disposed substantially parallel to a width of the rectangle.

12. The layout of claim 8, wherein gate layers corresponding to each of the pull-up device and the pull-down device are disposed substantially parallel to a length of the rectangle.

13. The layout of claim 8, wherein a dielectric material of the dielectric layer comprises SiON, Si3N4, Ta2O5, Al2O3, HfO, PEOX, TEOS, nitrogen content oxide layer, nitrided oxide, Hf content oxide, Ta content oxide, Al content oxide, high K material having K greater than 5, or a combination thereof.

14. The layout of claim 8, wherein a conductor material of top and bottom electrodes comprises W, Al, AlCu, Cu, Cu content, silicide, Ti, TiSi2, Co, CoSi2, Ni, NiSi, TiN, TiW, TaN, or a combination thereof.

15. The layout of claim 8, wherein each one of the first and second capacitors have a value less than 1 femto-farad.

16. The layout of claim 8, wherein a length of the rectangle is greater than a width of the rectangle.

17. The layout of claim 8, wherein each active region is arranged substantially parallel to a width of the rectangle.

18. The layout of claim 8, wherein a first manufacturing process for fabricating the bottom conductive electrode is substantially similar to a second manufacturing process for fabricating a standard contact for the SRAM cell without the bottom conductive electrode.

19. The device of claim 1, wherein said bottom contact electrode and said contact structure have a shape selected from the group consisting of a rectangle and an L-shape.

20. The layout of claim 8, wherein said first and second capacitor bottom conductive electrodes and said respective first and second contact structures have a shape selected from the group consisting of a rectangle and an L-shape.

* * * * *